United States Patent
Rozas

(10) Patent No.: US 10,387,253 B2
(45) Date of Patent: Aug. 20, 2019

(54) SYSTEM AND METHOD TO UTILIZE LARGER BLOCK SIZES FOR LOGICAL DISK AND FURTHER DECOMPOSE INTO SMALLER PHYSICAL BLOCK SIZES FOR REDUNDANT ENCODING BY UTILIZING ERASURE CODING

(71) Applicant: DATERA, INC., Sunnyvale, CA (US)

(72) Inventor: Guillermo Juan Rozas, Los Gatos, CA (US)

(\*) Notice: Subject to any disclaimer, the term of this patent is extended or adjusted under 35 U.S.C. 154(b) by 0 days.

(21) Appl. No.: 15/686,908

(22) Filed: Aug. 25, 2017

(65) Prior Publication Data
US 2019/0065310 A1    Feb. 28, 2019

(51) Int. Cl.
| | |
|---|---|
| *G06F 3/06* | (2006.01) |
| *H04L 1/00* | (2006.01) |
| *G06F 11/10* | (2006.01) |
| *H03M 13/15* | (2006.01) |
| *H03M 13/23* | (2006.01) |
| *H03M 13/37* | (2006.01) |

(52) U.S. Cl.
CPC ....... *G06F 11/1076* (2013.01); *H03M 13/154* (2013.01); *H03M 13/23* (2013.01); *H03M 13/373* (2013.01); *H03M 13/3761* (2013.01); *G06F 3/064* (2013.01); *H04L 1/0057* (2013.01); *H04L 1/0083* (2013.01)

(58) Field of Classification Search
CPC .. G06F 11/1076; G06F 3/064; H03M 13/154; H03M 13/2957; H03M 13/1515; H03M 13/27; H03M 13/2703; H03M 13/23; H03M 13/3761; H03M 13/373; H04L 1/005; H04L 1/0057; H04L 1/0041; H04L 1/0083

USPC .......................................................... 714/758
See application file for complete search history.

(56) References Cited

U.S. PATENT DOCUMENTS

| | | | | |
|---|---|---|---|---|
| 8,196,007 | B2* | 6/2012 | Limberg | H04L 1/0041 714/755 |
| 8,254,502 | B2* | 8/2012 | Sambhwani | H03M 13/2957 327/551 |
| 8,423,852 | B2* | 4/2013 | Garudadri | G10L 19/005 714/747 |
| 8,583,979 | B1* | 11/2013 | Zeng | H03M 13/27 714/752 |

(Continued)

*Primary Examiner* — James C Kerveros
(74) *Attorney, Agent, or Firm* — Barry Choobin; Patent 360

(57) ABSTRACT

Disclosed are a method and device in a network for utilizing larger block sizes for a logical disk, and further decomposing into smaller physical block sizes for a redundant encoding by utilizing an erasure coding logic to avoid a read☐modify☐write operation on a plurality of write operations. The device includes a receiving module, an encoding module, and a transmitting module. The receiving module configured to obtain a read request or a write request of a large block size to a storage unit over a network. In an embodiment, the storage unit comprising a plurality of physical devices of a smaller blocks size that is a divisor of the large block size. The encoding module to encode the received requests redundantly to persist media failures by reconstructing the requests on reads using the redundancy. The transmitting module transmits either a request command to initiate a read operation or an acknowledgment data on completion of a write operation.

6 Claims, 4 Drawing Sheets

(56) References Cited

U.S. PATENT DOCUMENTS

| | | | |
|---|---|---|---|
| 8,719,658 B2 * | 5/2014 | Cui ................. | H03M 13/2707 375/262 |
| 2015/0356005 A1 * | 12/2015 | Hayes ................ | G06F 12/0238 711/102 |

* cited by examiner

SYSTEM AND METHOD TO UTILIZE LARGER BLOCK SIZES FOR LOGICAL DISK AND FURTHER DECOMPOSE INTO SMALLER PHYSICAL BLOCK SIZES FOR REDUNDANT ENCODING BY UTILIZING ERASURE CODING

TECHNICAL FIELD

The present invention relates to the erasure☐coding scheme, in particular to a system and method that efficiently and economically utilize larger block sizes for a logical disk, and further decomposes into smaller physical block sizes for a redundant encoding by utilizing an erasure coding logic to avoid a read☐modify☐write operation on a plurality of write operations.

BACKGROUND

Background description includes information that may be useful in understanding the present invention. It is not an admission that any of the information provided herein is prior art or relevant to the presently claimed invention, or that any publication specifically or implicitly referenced is prior art.

Generally, Erasure coding is a technique to encode N equalized data elements into N+M same sized data elements for transmission or storage so that the original N data items can be recovered in the presence of up to M failures in the encoded N+M data elements. Such an encoding scheme is called a N+M erasure coding scheme. The space overhead of a N+M scheme is M/N. In most erasure coding schemes, the N input blocks are directly transmitted (or stored) unmodified to the output, but they are augmented with the M calculated 'parity' blocks. For example, a simple 2+1 coding scheme takes two equalized items, A and B, and produces an additional C which is the bit −XOR of A and B and transmits/stores A, B, and C with a space overhead of 50%. This scheme clearly tolerates a failure in any of A, B, or C, as any one of them can be recovered from the other two:

A=B XOR C

B=A XOR C

C=A XOR B

Erasure coding schemes can be quite complex and computationally expensive. Reed-Solomon encoding is the general technique used. The above XOR/parity scheme is an instance of Reed-Solomon codes, but they are far more complex when the intent is to be able to tolerate more than one failure. N+2 (with N often 8) Reed-Solomon codes are often used in Redundant Array of Inexpensive Disks (RAID) storage. Of course, such a scheme can be used with any storage medium (e.g. flash/SSD, persistent memory, etc.).

The traditional use of erasure coding for local storage is to take N+M identically sized disks and make them appear as one N times larger logical disk with internally redundantly encoded data that tolerates up to M disk failures (partial or total). The larger disk can then be software partitioned into logical partitions (logical disks) of any size. For example, 10×1 TB disk drives can be made to appear as a 1×8 TB logical disk drive with two-way redundancy by using an 8+2 erasure coding scheme such as Reed-Solomon. This allows the storage system to tolerate up to two disk failures with a space overhead of 25% (2/8). The logical 1×8 TB disk can then be software partitioned back into 8×1 TB logical disks, or any other combination (e.g. 1×5 TB logical partition plus 3×1 TB logical partitions). Although this form of erasure coding is space efficient, it comes at a performance cost, especially for writes.

Further, when reading a block of data, and assuming no disk failures, the block of data can be read directly from one of the unmodified copies (the right one of the N). The 'parity' blocks are only used to recover the original data in case one of the original N is unavailable either due to a partial or total disk failure.

However, when a block of data is written to the logical 8 TB disk, this block must be combined with the contents of the other N−1 (7 in this example) data items in order to recalculate the M parity blocks. This requires (even absent failures) reading N−1 blocks and writing N+M blocks. In other words, absent failures, reads do not require any additional operations (just the read), but writes are amplified tremendously, as a write of size S requires N−1 reads of size S and N+M writes of size S.

Although writes are generally more latency tolerant than reads (they can be buffered), the extra bandwidth requirements (both reads and writes) can become a bottleneck for the system, and this is unfortunate as many storage system applications require far more write bandwidth than read bandwidth as the software stack above the storage system often uses a large DRAM cache that significantly reduces the number of reads required. For example, databases have large in memory caches so that any locality to the data accesses result in fewer reads from the underlying storage system. Similarly, file systems have file/buffer caches that exploit locality to avoid reads. It is not uncommon that for real applications, the write to read proportion (in bytes, not IOPs) is 80/20 or more. Note that this amplification is particularly problematic for the newer storage media (e.g. flash/SSD, persistent memory) as in these newer storage media reads are much cheaper than writes, so any amplification of writes into more writes is undesirable. Additionally, For hard disk drives, reads are more expensive than writes as writes can often be buffered to exploit track locality, but reads often don't have such good locality as any locality in the reads has already been consumed by the in memory caches in the applications or file system.

Although the aforementioned description is in terms of a local storage system (single computer with multiple disk devices), the same applies to a distributed storage system where some of the data is on different computers (each possibly with multiple disk devices) and some of the data is in other computer, and the storage system handling the distribution of the data to provide the appearance of one single storage device. In such a distributed system, the reads require network round trips which further add latency to the writes and that can reduce the effective bandwidth of writes as well. But the situation is conceptually very similar to the single computer system although, in practice, distributed storage systems use mirroring rather than erasure coding for redundancy due to these performance issues, at a larger space overhead: to tolerate 1 failure, mirroring requires 100% space overhead, to tolerate 2 failures, mirroring requires 200% space overhead, and so on, while with erasure coding the space overhead can be made very small (just make N larger for a small M).

Thus, there is a dire need to provide a system and method that efficiently and economically utilize larger block sizes for a logical disk and further, decomposes into smaller physical block sizes for a redundant encoding by utilizing an erasure coding logic to avoid a read-modify-write operation on a plurality of write operations. Further, there is also a need for an erasure coding scheme where absent failures or the writes result in no amplification even if the reads result in some amplification.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, the numbers expressing quantities or dimensions of items, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context.

The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability.

SUMMARY

The present invention mainly solves the technical problems of the prior art. In response to these problems, the present invention provides a system and method that efficiently and economically utilize larger block sizes for a logical disk and further decomposes into smaller physical block sizes for a redundant encoding by utilizing an erasure coding logic to avoid a read☐modify☐write operation on a plurality of write operations. The present invention achieves the data redundancy with smaller data amplification by using erasure coding while avoiding expensive read☐modify☐write operations for writes to the logical disk. Further, the present invention avoids the read☐modify☐writes by using miss☐matched block sizes.

An aspect of the present disclosure relates to a method that includes the step of receiving, by a processor of a computing device, a read request, or a write request of a large block size to a storage unit over a network, wherein the storage unit comprising a plurality of physical devices of a smaller block size that is a divisor of the large block size. The method further includes the step of encoding, by the processor, the received requests redundantly to persist media failures by reconstructing the requests on reads using the redundancy. Then the method includes the step of transmitting, by the processor, either a request command to initiate a read operation, or an acknowledgment data on completion of a write operation.

In an aspect, the step of receiving the read request further comprises the steps of mapping the plurality of physical devices with a portion of the read request, and further de-interleaving the mapped portion; transmitting a set of parallel read sub-requests to the plurality of physical devices to receive a corresponding partial data; and producing a desired result by interleaving and concatenating the data which is different from the corresponding partial data.

In an aspect, the step of receiving the write request comprises the step of de☐interleaving into parts that correspond to a plurality of non☐parity physical devices; and computing redundant 'parity' blocks, and transmitting the parts including non☐parity or parity to the appropriate physical devices.

An aspect of the present disclosure relates to a device in a network. The device includes a non-transitory storage device having embodied therein one or more routines operable to utilize larger block sizes for a logical disk, and further decompose into smaller physical block sizes for a redundant encoding by utilizing an erasure coding logic to avoid a read☐modify☐write operation on plurality of write operations, and one or more processors coupled to the non-transitory storage device and operable to execute the one or more routines.

The one or more routines include a receiving module, an encoding module, and a transmitting module. The receiving module is configured to obtain a read request or a write request of a large block size to a storage unit over a network. In an embodiment, the storage unit comprising a plurality of physical devices of a smaller blocks size that is a divisor of the large block size. The encoding module is configured to encode the received requests redundantly to persist media failures by reconstructing the requests on reads using the redundancy. The transmitting module is configured to transmit either a request command to initiate a read operation or an acknowledgment data on completion of a write operation.

In an aspect, the receiving module is further configured to map the plurality of physical devices with a portion of the read request, and further de-interleaving the mapped portion; transmit a set of parallel read sub-requests to the plurality of physical devices to receive a corresponding partial data; and produce a desired result by interleaving and concatenating the data which is different from the corresponding partial data.

In an aspect, the receiving module is further configured to de☐interleave into parts that correspond to a plurality of non☐parity physical devices; and compute redundant 'parity' blocks, and transmit the parts including non☐parity or parity to the appropriate physical devices.

Other features of embodiments of the present disclosure will be apparent from accompanying drawings and from the detailed description that follows.

BRIEF DESCRIPTION OF THE DRAWINGS

In the figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

DETAILED DESCRIPTION

Figure 1:
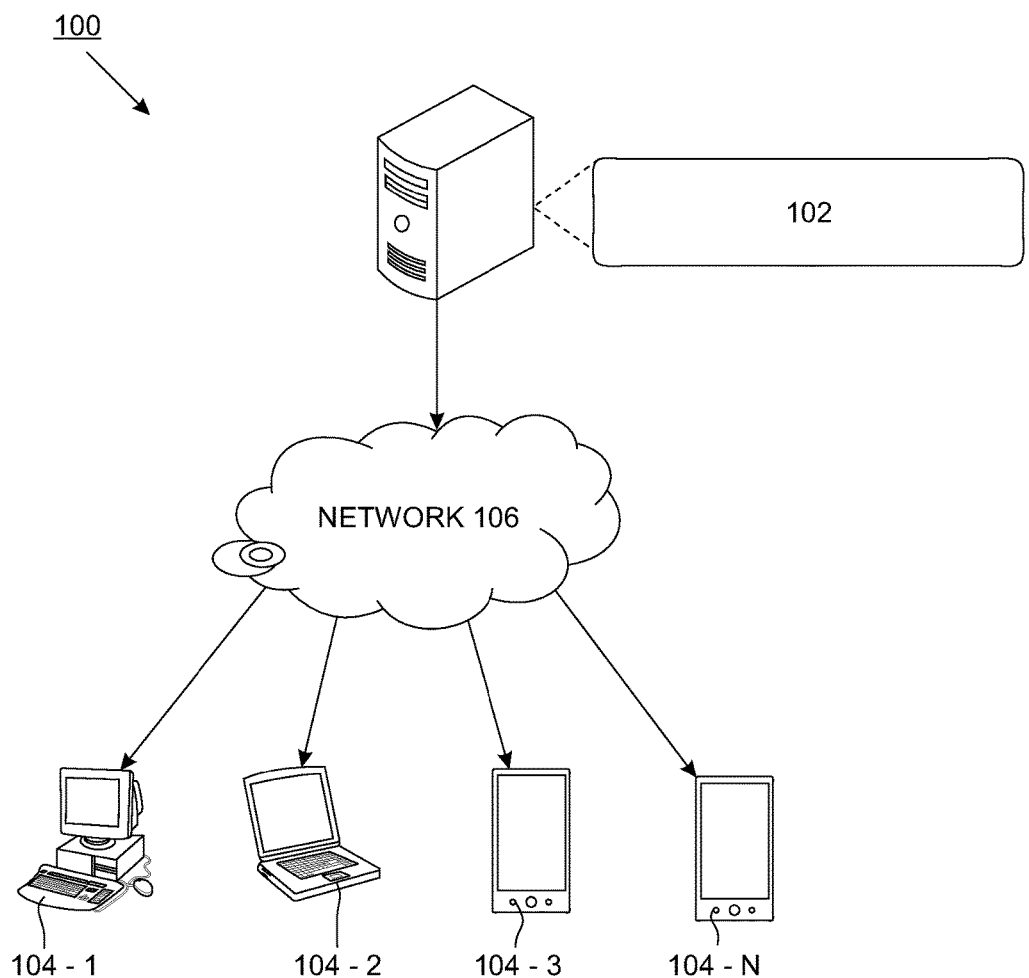
FIG. 1 illustrates a network implementation of a system to utilize larger block sizes for a logical disk, and further decompose into smaller physical block sizes for a redundant encoding by utilizing an erasure coding logic to avoid a read☐modify☐write operation on a plurality of write operations, in accordance with an embodiment of the present subject matter.

Systems and methods are disclosed for utilizing larger block sizes for a logical disk, and further decomposing into smaller physical block sizes for a redundant encoding by utilizing an erasure coding logic to avoid a read☐modify☐write operation on a plurality of write operations. Embodiments of the present disclosure include various steps, which will be described below. The steps may be performed by hardware components or may be embodied in machine-executable instructions, which may be used to cause a general-purpose or special-purpose processor programmed with the instructions to perform the steps. Alternatively, steps may be performed by a combination of hardware, software, firmware, and/or by human operators.

Embodiments of the present disclosure may be provided as a computer program product, which may include a machine-readable storage medium tangibly embodying thereon instructions, which may be used to program a computer (or other electronic devices) to perform a process. The machine-readable medium may include, but is not limited to, fixed (hard) drives, magnetic tape, floppy diskettes, optical disks, compact disc read-only memories (CD-ROMs), and magneto-optical disks, semiconductor memories, such as ROMs, PROMs, random access memories (RAMs), programmable read-only memories (PROMs), erasable PROMs (EPROMs), electrically erasable PROMs (EEPROMs), flash memory, magnetic or optical cards, or other type of media/machine-readable medium suitable for storing electronic instructions (e.g., computer programming code, such as software or firmware).

Various methods described herein may be practiced by combining one or more machine-readable storage media containing the code according to the present disclosure with appropriate standard computer hardware to execute the code contained therein. An apparatus for practicing various embodiments of the present disclosure may involve one or more computers (or one or more processors within a single computer) and storage systems containing or having network access to computer program(s) coded in accordance with various methods described herein, and the method steps of the disclosure could be accomplished by modules, routines, subroutines, or subparts of a computer program product.

If the specification states a component or feature "may", "can", "could", or "might" be included or have a characteristic, that particular component or feature is not required to be included or have the characteristic.

Although the present disclosure has been described with the purpose of utilizing larger block sizes for a logical disk, and further decomposing into smaller physical block sizes for a redundant encoding by utilizing an erasure coding logic to avoid a read☐modify☐write operation on plurality of write operations, it should be appreciated that the same has been done merely to illustrate the invention in an exemplary manner and any other purpose or function for which explained structures or configurations can be used, is covered within the scope of the present disclosure.

Exemplary embodiments will now be described more fully hereinafter with reference to the accompanying drawings, in which exemplary embodiments are shown. This invention may, however, be embodied in many different forms and should not be construed as limited to the embodiments set forth herein. These embodiments are provided so that this disclosure will be thorough and complete and will fully convey the scope of the invention to those of ordinary skill in the art. Moreover, all statements herein reciting embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Thus, for example, it will be appreciated by those of ordinary skill in the art that the diagrams, schematics, illustrations, and the like represent conceptual views or processes illustrating systems and methods embodying this invention. The functions of the various elements shown in the figures may be provided through the use of dedicated hardware as well as hardware capable of executing associated software. Similarly, any switches shown in the figures are conceptual only. Their function may be carried out through the operation of program logic, through dedicated logic, through the interaction of program control and dedicated logic, or even manually, the particular technique being selectable by the entity implementing this invention. Those of ordinary skill in the art further understand that the exemplary hardware, software, processes, methods, and/or operating systems described herein are for illustrative purposes and, thus, are not intended to be limited to any particular name.

The ensuing description provides exemplary embodiments only and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

The term "machine-readable storage medium" or "computer-readable storage medium" includes, but is not limited to, portable or non-portable storage devices, optical storage devices, and various other mediums capable of storing, containing, or carrying instruction(s) and/or data. A machine-readable medium may include a non-transitory medium in which data can be stored and that does not include carrier waves and/or transitory electronic signals propagating wirelessly or over wired connections. Examples of a non-transitory medium may include but are not limited to, a magnetic disk or tape, optical storage media such as compact disk (CD) or digital versatile disk (DVD), flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. A processor(s) may perform the necessary tasks.

The erasure code incorporates redundancy to the system to tolerate failures. In replication, each byte of data is stored on two disks to tolerate any failure scenarios, so long as every piece of data has one surviving copy. Replication consumes quite a lot of resources. Specifically, the storage costs are doubled, and there are scenarios in which two failed storage components lead to data loss. More complex erasure codes, such as Reed-Solomon codes, tolerate broader classes of failure scenarios with less extra storage. As such, they are applicable to today's storage systems, providing higher levels of fault-tolerance with less cost.

Further, in communications, errors arise when bits are corrupted in a message. This differs from an erasure because the location of the corruption is unknown. Furthermore, the traditional erasure coding assumes that the block size of a logical disk is the same as the block size of the physical 'disks' or network nodes, and thus writes require "read☐modify☐write" which is expensive.

Thus, there is a need for a system and method that efficiently and economically utilize larger block sizes for a logical disk and further, decomposes into smaller physical block sizes for a redundant encoding by utilizing an erasure coding logic to avoid a read☐modify☐write operation on a plurality of write operations.

The present invention solves the technical problems of the prior art. In response to these problems, the present invention provides a system and method that efficiently and economically utilizes that efficiently and economically utilize larger block sizes for a logical disk, and further decomposes into smaller physical block sizes for a redundant encoding by utilizing an erasure coding logic to avoid a read☐modify☐write operation on plurality of write operations. Further the utilization of the present system and method is cost efficient because traditionally mirroring (which also avoids read☐modify☐write) has a higher cost in storage as P full copies of the data are required, while in the erasure coding requires only P partial redundancy blocks (each 1/N in size of the full block), so the cost of the storage system is lower. In addition, due to the avoidance of read☐modify☐write, critical write performance is also increased.

An aspect of the present disclosure relates to a method that includes the step of receiving, by a processor of a computing device, a read request, or a write request of a large block size to a storage unit over a network, wherein the storage unit comprising plurality of physical devices of a smaller block size that is a divisor of the large block size. The method further includes the step of encoding, by the processor, the received requests redundantly to persist media failures by reconstructing the requests on reads using the redundancy. Then the method includes the step of transmitting, by the processor, either a request command to initiate a read operation, or an acknowledgment data on completion of a write operation.

In an aspect, the step of receiving the read request is further comprising the steps of mapping the plurality of physical devices with a portion of the read request, and further de-interleaving the mapped portion; transmitting a set of parallel read sub-requests to the plurality of physical devices to receive a corresponding partial data; and producing a desired result by interleaving and concatenating the data which is different from the corresponding partial data.

In an aspect, the step of receiving the write request comprising the step of de☐interleaving into parts that correspond to a plurality of non☐parity physical devices; and computing redundant 'parity' blocks, and transmitting the parts including non☐parity or parity to the appropriate physical devices.

An aspect of the present disclosure relates to a device in a network. The device includes a non-transitory storage device having embodied therein one or more routines operable to utilize larger block sizes for a logical disk, and further decompose into smaller physical block sizes for a redundant encoding by utilizing an erasure coding logic to avoid a read☐modify☐write operation on plurality of write operations, and one or more processors coupled to the non-transitory storage device and operable to execute the one or more routines.

The one or more routines include a receiving module, an encoding module, and a transmitting module. The receiving module is configured to obtain a read request or a write request of a large block size to a storage unit over a network. In an embodiment, the storage unit comprising a plurality of physical devices of a smaller block size that is a divisor of the large block size. The encoding module is configured to encode the received requests redundantly to persist media failures by reconstructing the requests on reads using the redundancy. The transmitting module is configured to transmit either a request command to initiate a read operation or an acknowledgment data on completion of a write operation.

In an aspect, the receiving module is further configured to map the plurality of physical devices with a portion of the read request, and further de-interleaving the mapped portion; transmit a set of parallel read sub-requests to the plurality of physical devices to receive a corresponding partial data; and produce a desired result by interleaving and concatenating the data which is different from the corresponding partial data.

In an aspect, the receiving module is further configured to de☐interleave into parts that correspond to a plurality of non☐parity physical devices; and compute redundant 'parity' blocks, and transmitting the parts including non☐parity or parity to the appropriate physical devices.

FIG. 1 illustrates a network implementation 100 of a system 102 to utilize larger block sizes for a logical disk, and further decompose into smaller physical block sizes for a redundant encoding by utilizing an erasure coding logic to avoid a read☐modify☐write operation on plurality of write operations, in accordance with an embodiment of the present subject matter. In one embodiment, the system 102 utilizes larger block sizes for a logical disk, and further decompose into smaller physical block sizes.

It will be understood that the present system 102 may be accessed by multiple users through one or more user devices 104-1, 104-2 . . . 104-N, collectively referred to as user 104 hereinafter, or applications residing on the user devices 104. Examples of the user devices 104 may include but are not limited to, a portable computer, a personal digital assistant, a handheld device, and a workstation. The user devices 104 are communicatively coupled to the present system 102 through a network 106.

In one implementation, the network 106 may be a wireless network, a wired network or a combination thereof. The network 106 can be implemented as one of the different types of networks, such as an intranet, local area network (LAN), wide area network (WAN), the internet, and the like. The network 106 may either be a dedicated network or a shared network. The shared network represents an association of the different types of networks that use a variety of protocols, for example, Hypertext Transfer Protocol (HTTP), Transmission Control Protocol/Internet Protocol (TCP/IP), Wireless Application Protocol (WAP), and the like, to communicate with one another. Further, the network 106 may include a variety of network devices, including routers, bridges, servers, computing devices, storage devices, and the like.

Figure 2:
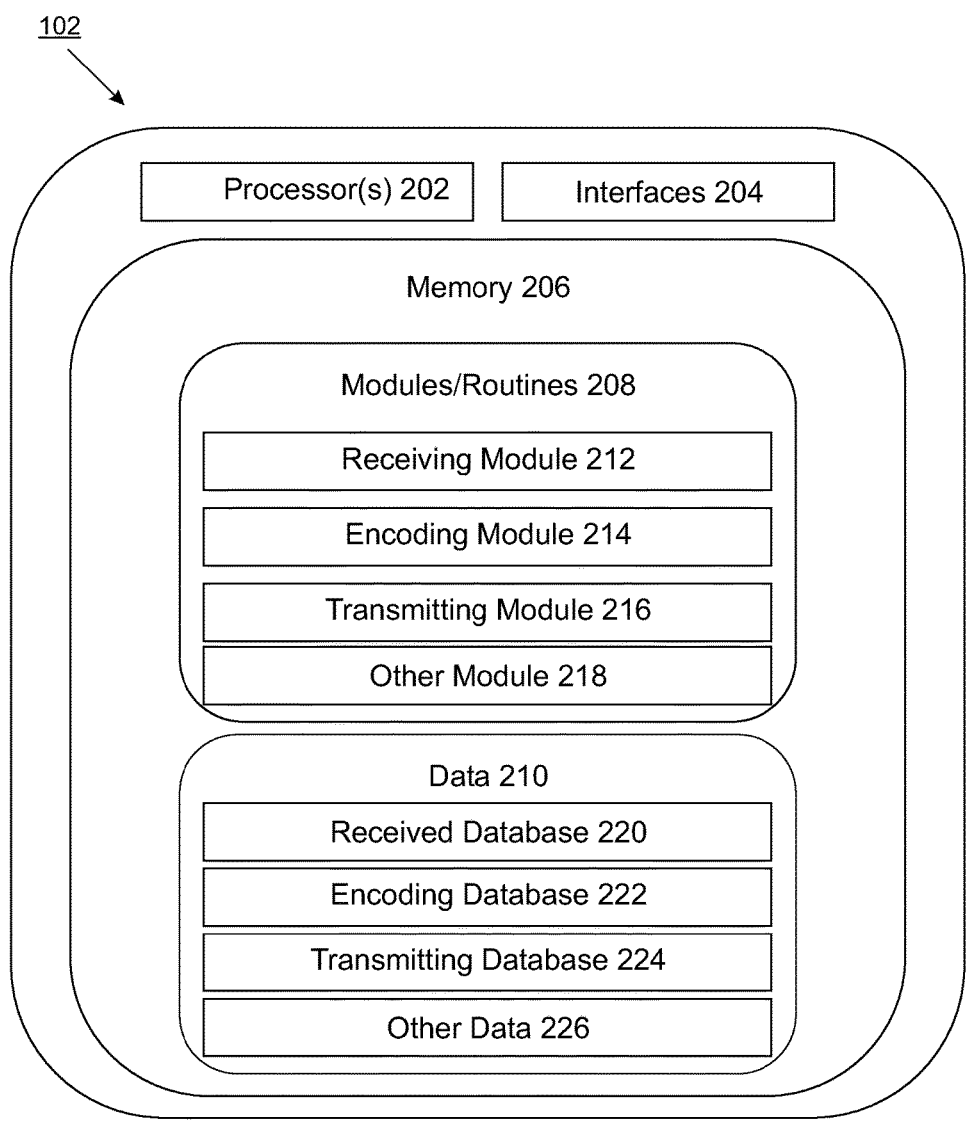
FIG. 2 illustrates the proposed system and method, in accordance with an embodiment of the present subject matter.

FIG. 2 illustrates the proposed system 102, in accordance with an embodiment of the present subject matter. Referring now to FIG. 2, the system 102 is illustrated in accordance with an embodiment of the present subject matter. In one embodiment, the present system 102 may include at least one processor 202, an input/output (I/O) interface 204, and a memory 206. The at least one processor 202 may be implemented as one or more microprocessors, microcomputers, microcontrollers, digital signal processors, central processing units, state machines, logic circuitries, and/or any devices that manipulate signals based on operational instructions. Among other capabilities, the at least one processor 202 is configured to fetch and execute computer-readable instructions stored in the memory 206.

The I/O interface 204 may include a variety of software and hardware interfaces, for example, a web interface, a graphical user interface, and the like. The I/O interface 204 may allow the storage resource placement decision system 102 to interact with a user directly or through the client devices 104. Further, the I/O interface 204 may enable the present system 102 to communicate with other computing devices, such as web servers and external data servers (not shown). The I/O interface 204 can facilitate multiple communications within a wide variety of networks and protocol types, including wired networks, for example, LAN, cable, etc., and wireless networks, such as WLAN, cellular, or satellite. The I/O interface 204 may include one or more ports for connecting a number of devices to one another or to another server.

The memory 206 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 206 may include modules 208 and data 210.

The modules 208 include routines, programs, objects, components, data structures, etc., which perform particular tasks or implement particular abstract data types. In one implementation, the modules 208 may include a receiving module 212, an encoding module 214, a transmitting module 216, and other modules 218. The other modules 218 may include programs or coded instructions that supplement applications and functions of the present system 102.

The data 210, amongst other things, serves as a repository for storing data processed, received, and generated by one or more of the modules 208. The data 210 may also include received database 220, encoding database 222, transmitting database 224, and other data 226. The other data 226 may include data generated as a result of the execution of one or more modules in the other module 218.

In one implementation, the receiving module 212 is configured to obtain a read request, or a write request of a large block size to a storage unit over a network, wherein the storage unit comprising a plurality of physical devices of a smaller block size that is a divisor of the large block size. The encoding module 214 is configured to encode the received requests redundantly to persist media failures by reconstructing the requests on reads using the redundancy. The transmitting module 216 is configured to transmit either a request command to initiate a read operation or an acknowledgment data on completion of a write operation.

In an embodiment, the receiving module 212 which receives the read request is further configured to map the plurality of physical devices with a portion of the read request, and further de-interleaving the mapped portion; transmit a set of parallel read sub-requests to the plurality of physical devices to receive a corresponding partial data; and produce a desired result by interleaving and concatenating the data which is different from the corresponding partial data.

In an embodiment, the receiving module 212 which receives the write request is further configured to de☐interleave into parts that correspond to a plurality of non☐parity physical devices; and compute redundant 'parity' blocks and transmits the parts including non☐parity or parity to the appropriate physical devices.

In an implementation, the receiving module 212 implements the logical disk and contains the erasure☐coding logic. The receiving module 212 takes input either over the network (e.g. iSCSI protocol) or as direct requests from a read or write system call through the operating system's block layer. This input can be either a read request or a write request. The write request responses are simple acknowledgments and the read request responses consist of the requested data.

Figure 3:
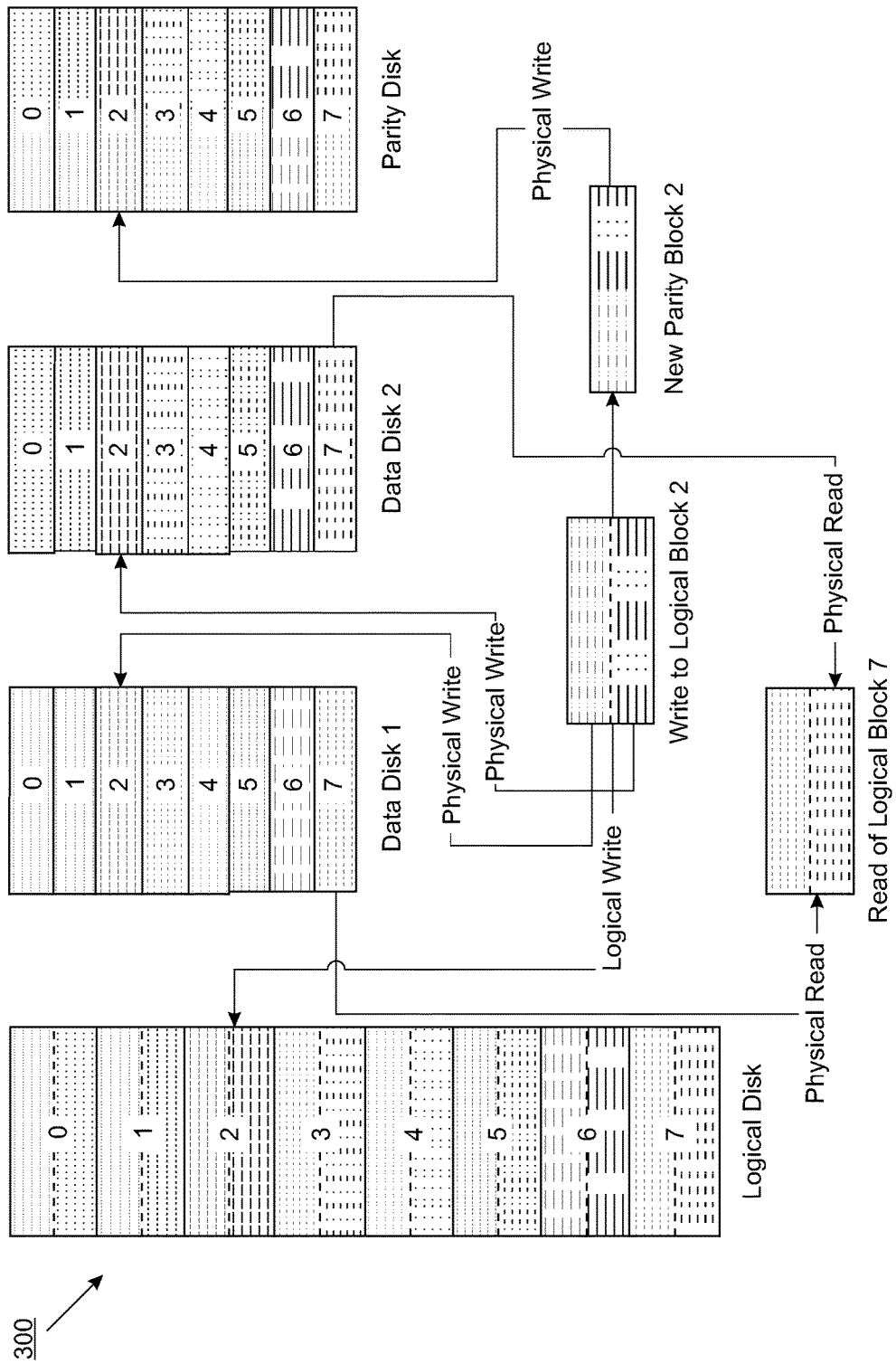
FIG. 3 illustrates the exemplary block diagram of the proposed erasure coding scheme, in accordance with an embodiment of the present subject matter.

FIG. 3 illustrates the exemplary block diagram 300 of the proposed erasure coding scheme, in accordance with an embodiment of the present subject matter. The logical blocks are double the size of the physical blocks. Further, all the disks have eight blocks without interleaving or striping. Furthermore, the present disclosure describes the usage of some concrete sizes for illustration purposes. However, other combinations of sizes may also be used. For example, the raw devices (or storage servers in a distributed storage system) have an atomic block size of 512 B (Bytes). This means that all the reads and the writes to the raw devices must be aligned to a multiple of 512 B and sized as multiples of 512 B. However, the logical disk exported (the 1×8 TB disk from the example above) uses a larger_ block size, say 4 KiB (Kibibyte). Now, each logical block (4 KiB) is really made up of 8 'physical' blocks (512 B each). So the present system can arrange the logical to physical mapping such that each logical 4 KiB is mapped to 512B on each of the 8 'data' disks and 512 B of 'parity' on each of the 'parity' disks. Absent disk failures, a read of a logical 4 KiB block requires 8 parallel reads of 512B each and 'concatenation' of the results. Thus, a single S-sized read result in N S/N sized reads. Then the present system amplifies the number of reading operations going from logical to physical, but not the bandwidth required (N*S/N=S).

However, on a write, the present system does not perform any reads. The present system has all N components provided together due to the 'mismatch' of the block size. As there is no way to write to the logical disk except in blocks aligned to and multiples of 4 KiB, every write is always providing all N (8) of the blocks that are needed to compute the parity blocks at the same time. Thus a write of 4 KiB results in 8 direct writes of 512 B each (one to each of the 'data' disks) and 2 direct writes of 512B each (one to each of the 'parity' disks). The actual encoding can be Reed-Solomon or any other known scheme.

The present erasure coding scheme taking advantage of the difference in the block size between the logical level and the physical level so that every write writes all N 'siblings' together and thus requires no reads. For reads, the bandwidth is the same as in the traditional scheme, but the number of IOPs is amplified by a factor of N. The reads are in parallel, so although more round trips are required, they are not serial round trips but parallel round trips and hence the latency of the reads is not affected, modulo congestion at the network or media due to the increased number of IOPs. For writes, the bandwidth is reduced from the traditional scheme: for the same 4 KiB block, the traditional erasure coding scheme would have read 7*4 KiB of data and written 3*4 KiB of data, for a total of 40 KiB of data read/written, while this scheme only writes 5 KiB of data (512B to each of 10 disks), a factor of N(=8) savings, and the new scheme saves all the reads and round trips due to reads (which are serial in the traditional scheme and thus add latency).

In the present erasure coding scheme, the logical block size should be larger (and a multiple of) than the physical block size. The above 4 KiB/512B combination is common, but for lower N (which is generally the case in a distributed storage system) the present erasure coding scheme can use 4 KiB/2 KiB or 4 KiB/1 KiB. Further, if the local devices (or the servers in the distributed storage system) can support sub 512B blocks, then the logical size can be 512B. For example, 512B/64B would provide a storage system with the 'traditional' logical storage size as long as the underlying 'physical' drives (or storage servers for a distributed system) can support 64B blocks. Other persistent memory technologies or storage technologies such as Intel's 3DXpoint can naturally support 64B block sizes.

Additionally, in the case of a thin-provisioned distributed storage system, it is not conceptually hard to support such smaller block sizes by performing write aggregation even if the physical devices used to have larger block sizes. It's mostly a matter of the granularity of metadata. Finally, even if the logical volume must have the same block size as the underlying physical blocks (e.g. 512B/512B), in modern workloads it is rare that I/Os are not aligned and sized to multiples of 4 KiB, and this can be taken advantage of. The system can operate as if it was 4 KiB/512 B, and for I/Os that are in fact aligned and sized properly, work as described. Any read that does not match the alignment/size constraints can 'over read' and just return the desired data. Any write that does not match the alignment/size constraints can be emulated by a read/modify/write sequence that preserves the alignment restrictions. As any such writes are generally very rare, this should not be a performance problem in practice and note that in those cases, the system behaves very similarly to the way that traditional erasure coding behaves, but only needs to do it for writes with unusual alignment/size, and not for every write.

Figure 4:
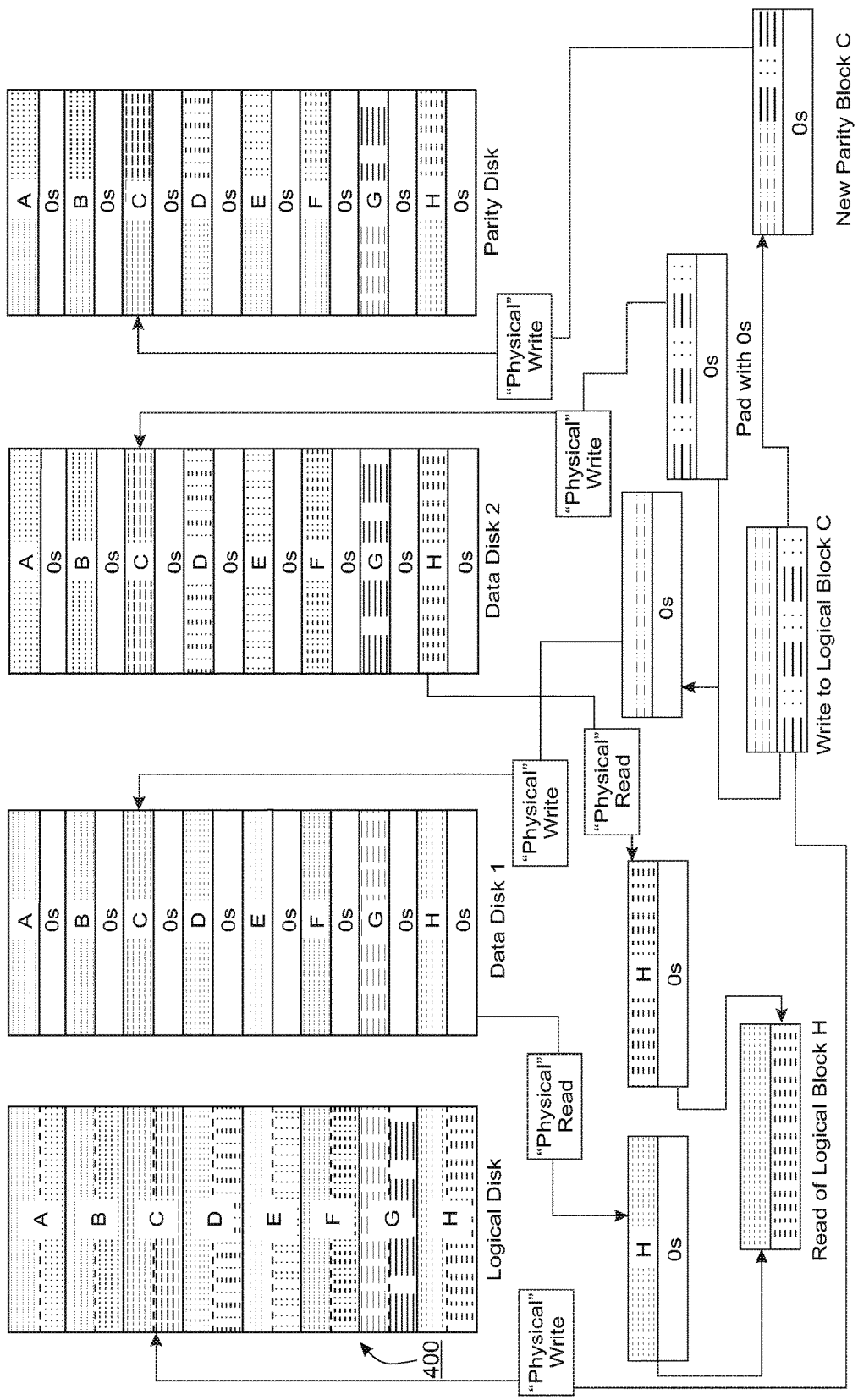
FIG. 4 illustrates an exemplary block diagram of a zero-padded erasure coding scheme, in accordance with an embodiment of the present subject matter.

Thus the present erasure coding scheme provides offset compression because the physical volumes are a fraction of the size of the logical volume, and the offsets of the blocks adjusted accordingly. However, in an additional embodiment, the present erasure coding scheme may not require offset compression. FIG. 4 illustrates an exemplary block diagram 400 of a zero-padded erasure coding scheme, in accordance with an embodiment of the present subject matter. FIG. 4 shows that the logical volumes and the 'physical' volumes are of the same size and all the disks have 8 blocks. In order to avoid offset compression at least one of interleaving, de-interleaving, and padding is done sub-512 B so that the present erasure coding scheme can support the logical volumes of 512 B. In this exemplary erasure coding scheme, there is no apparent data reduction. When the 'physical' data disks perform compression, the 0 s added for padding to preserve the 512 B granularity are not stored. Therefore the actual data reduction occurs as expected. Further, in this exemplary erasure coding scheme, the 'real data' is smaller and the size (after padding) and offsets remain the same.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously. Within the context of this document terms "coupled to" and "coupled with" are also used euphemistically to mean "communicatively coupled with" over a network, where two or more devices are able to exchange data with each other over the network, possibly via one or more intermediary device.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

The term "and/or" means that "and" applies to some embodiments and "or" applies to some embodiments. Thus, A, B, and/or C can be replaced with A, B, and C wrote in one sentence and A, B, or C written in another sentence. A, B, and/or C means that some embodiments can include A and B, some embodiments can include A and C, some embodiments can include B and C, some embodiments can only include A, some embodiments can include only B, some embodiments can include only C, and some embodiments can include A, B, and C. The term "and/or" is used to avoid unnecessary redundancy.

Where the specification claims refer to at least one of something selected from the group consisting of A, B, C . . . and N, the text should be interpreted as requiring only one element from the group, not A plus N, or B plus N, etc. The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

While embodiments of the present disclosure have been illustrated and described, it will be clear that the disclosure is not limited to these embodiments only. Numerous modifications, changes, variations, substitutions, and equivalents will be apparent to those skilled in the art, without departing from the spirit and scope of the disclosure, as described in the claims.

The invention claimed is:

1. A method to utilize larger block sizes for a logical disk, and further decompose into smaller physical block sizes for a redundant encoding by utilizing an erasure coding logic, the method comprising the steps of:
   receiving, by a processor of a computing device, a read request, and a write request of a large block size to a storage unit over a network, wherein the storage unit comprising a plurality of physical devices, wherein the step of receiving the read request comprising the steps of: mapping the plurality of physical devices with a portion of the read request, and further de-interleaving the mapped portion; transmitting a set of parallel read sub-requests to the plurality of physical devices to receive a corresponding partial data; and producing a result by interleaving and concatenating the data which is different from the corresponding partial data;
   encoding, by the processor, the received read request and the write request to persist media failures by reconstructing the requests on reads using the redundancy; and
   transmitting, by the processor, either a request command to initiate a read operation and an acknowledgment data on completion of a write operation.

2. The method as claimed in claim 1, wherein the step of receiving the write request comprising the step of:
   de-interleaving into parts that correspond to a plurality of non-parity physical devices; and
   computing redundant 'parity' blocks, and transmitting the parts including non-parity and parity to the appropriate physical devices.

3. A device in a network, comprising:
   a non-transitory storage device having embodied therein one or more routines operable to utilize larger block sizes for a logical disk, and further decompose into smaller physical block sizes for a redundant encoding by utilizing an erasure coding logic; and
   one or more processors coupled to the non-transitory storage device and operable to execute the one or more routines, wherein the one or more routines include:
      a receiving module configured to obtain a read request, and a write request of a large block size to a storage unit over a network, wherein the storage unit comprising a plurality of physical devices, wherein the receiving module is configured to: map the plurality of physical devices with a portion of the read request, and further de-interleaving the mapped portion; transmit a set of parallel read sub-requests to the plurality of physical devices to receive a corresponding partial data; and produce a result by interleaving and concatenating the data which is different from the corresponding partial data;
      an encoding module configured to encode the received to persist media failures by reconstructing the requests on reads using the redundancy; and
      a transmitting module configured to transmit either a request command to initiate a read operation and an acknowledgment data on completion of a write operation.

4. The device as claimed in claim 3, wherein the receiving module which receives the read request is further configured to:
   de-interleave into parts that correspond to a plurality of non-parity physical devices; and
   compute redundant 'parity' blocks, and transmits the parts including non-parity and parity to the appropriate physical devices.

5. A method to utilize a zero-padded erasure coding scheme including an equal volume of a logical disk, and a physical disk, the method comprising the steps of:
   receiving, by a processor of a computing device, a read request, and a write request of a logical disk to a storage unit over a network, wherein the storage unit comprising a plurality of physical devices of a physical disk to perform compression to recover desired data efficiency;
   encoding, by the processor, the received requests to persist media failures by reconstructing the requests on reads using the redundancy;
   performing, by the processor, at least one of interleaving, de-interleaving, and padding at sub-512 bytes to support the logical volume of the 512 bytes;
   transmitting, by the processor, either a request command to initiate a read operation and an acknowledgment data on completion of a write operation, and
   reducing data by not storing the padded zeros while physical disk performs compression to recover desired data efficiency.

6. The method as claimed in claim 5, wherein the zeros are added for padding to preserve granularity of the logical volume of 512 bytes.

* * * * *